(12) United States Patent
Kim et al.

(10) Patent No.: US 9,607,993 B1
(45) Date of Patent: Mar. 28, 2017

(54) CAPACITOR-TRANSISTOR STRAP CONNECTIONS FOR A MEMORY CELL

(71) Applicant: GLOBALFOUNDRIES INC., Grand Cayman (KY)

(72) Inventors: Byeong Y. Kim, Hopewell Junction, NY (US); William L. Nicoll, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/007,937

(22) Filed: Jan. 27, 2016

(51) Int. Cl.
*H01L 29/94* (2006.01)
*H01L 27/108* (2006.01)

(52) U.S. Cl.
CPC .. *H01L 27/10867* (2013.01); *H01L 27/10838* (2013.01)

(58) Field of Classification Search
CPC ................................................ H01L 27/10838
USPC .................... 438/241, 259, 270; 257/301
See application file for complete search history.

(56) References Cited

U.S. PATENT DOCUMENTS

| 7,129,130 B2* | 10/2006 | Adkisson .......... H01L 27/10841 257/301 |
| 2013/0146957 A1* | 6/2013 | Cheng ................. H01L 27/1203 257/301 |
| 2013/0320422 A1 | 12/2013 | Chang et al. |
| 2016/0190140 A1* | 6/2016 | Basker .............. H01L 27/10829 257/532 |

OTHER PUBLICATIONS

Kim et al., U.S. Appl. No. 14/582,655, filed Dec. 24, 2014.

\* cited by examiner

*Primary Examiner* — Dung Le
(74) *Attorney, Agent, or Firm* — Thompson Hine LLP (57) ABSTRACT

Capacitor strap connections for a memory cell and device structures for making such capacitor strap connections. A deep trench capacitor is formed in a substrate. A collar comprised of an electrical insulator is formed at least partially inside an upper section of a deep trench in which the deep trench capacitor is formed. A portion of the collar is removed to define a notch extending through the collar, and a connection strap is formed in the notch. A fin is formed from a portion of the substrate, and is coupled by the connection strap with an electrode of the deep trench capacitor that is located inside the deep trench.

19 Claims, 6 Drawing Sheets

CAPACITOR-TRANSISTOR STRAP CONNECTIONS FOR A MEMORY CELL

BACKGROUND

The invention relates generally to semiconductor devices and integrated circuit fabrication and, in particular, to capacitor-transistor strap connections for a memory cell and methods for making such capacitor-transistor strap connections.

Dynamic random access memory (DRAM) devices are the most commonly used type of semiconductor memory and, thus, are found in many integrated circuit designs. A generic DRAM includes a plurality of substantially identical memory cell arrays, a plurality of bit lines, and a plurality of word lines that intersect the bit lines. Each individual memory cell array includes a plurality of memory cells arranged in rows and columns. Each individual memory cell includes a capacitor for storing data in the form of charges and an access device, such as a field effect transistor (FET), for allowing the transfer of charge to, and from, the capacitor during read and write operations. Each memory cell in the array is located at the intersection of one of the word lines and one of the bit lines. Either the source or drain of the access device is connected to one of the bit lines and the gate of the access device is connected to one of the word lines.

A variety of field effect transistor, known as a fin-type field effect transistor (FinFET), may be used as an access device in a memory cell. A FinFET may be fabricated using a silicon-on-insulator (SOI) wafer that includes a device layer of a single crystal semiconductor, such as silicon. Each FinFET includes a narrow vertical semiconductor body or fin fashioned from the device layer. A conductive gate electrode intersects a channel of the fin and is isolated electrically from the fin by a thin gate dielectric layer. The opposite ends of the fin, which are not covered by the gate electrode, are heavily doped to define a source and a drain. When a voltage exceeding a characteristic threshold voltage is applied to the gate electrode, charge carriers flow through the channel between the source and drain to create an output current that may be used in read and write operations.

Improved capacitor-transistor strap connections for a memory cell and methods for making such capacitor-transistor strap connections are needed.

SUMMARY

In an embodiment of the invention, a method is provided for fabricating a device structure. A deep trench is formed in a substrate, and a collar composed of an electrical insulator is formed at least partially inside an upper section of the deep trench. A portion of the collar is removed to define a notch extending through the collar, and a connection strap is formed in the notch. A fin is formed from a semiconductor material of the substrate. The fin is coupled by the connection strap with an electrode of the deep trench capacitor that is inside the deep trench.

In an embodiment of the invention, a device structure includes a deep trench capacitor including a deep trench formed in a substrate and an electrode inside the deep trench. A collar is located at least partially inside an upper section of the deep trench. The collar is comprised of an electrical insulator, and includes a notch that extends through the collar. A field effect transistor includes a fin coupled by a connection strap inside the notch with the electrode inside the deep trench.

In an embodiment of the invention, a device structure includes a collar extending circumferentially about a deep trench defined in a substrate. The collar is composed of an electrical insulator and includes a notch connecting an interior of the collar with an exterior of the collar. The device structure further includes a semiconductor body having a connection strap positioned inside the notch in the collar.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
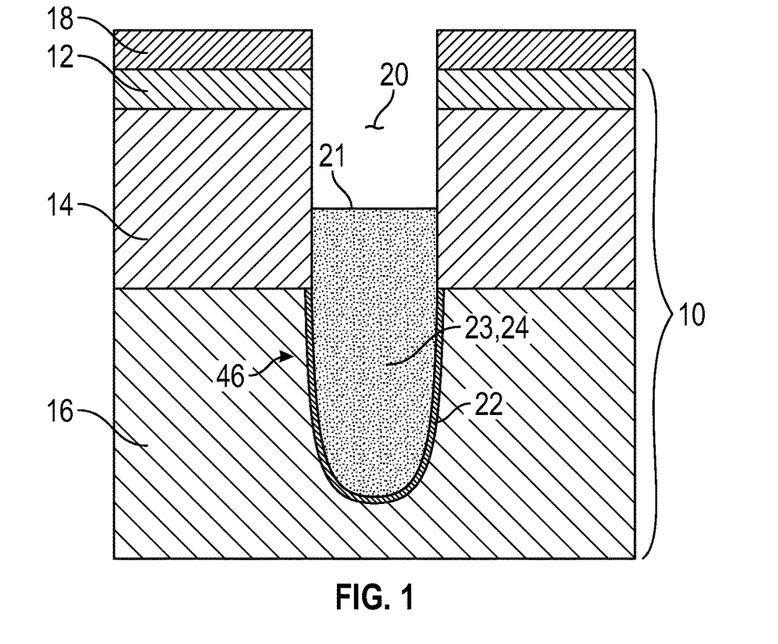
FIGS. 1-5 are cross-sectional views of a portion of a substrate illustrating successive stages of a fabrication process forming a device structure in accordance with an embodiment of the invention.

With reference to FIG. 1 and in accordance with an embodiment of the invention, an semiconductor-on-insulator (SOI) substrate 10 includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as silicon. The BOX layer 14 has a surface in direct contact with the handle wafer 16 along an interface and another surface in direct contact with the device layer 12 along an interface, and these surfaces are separated by the thickness of the BOX layer 14 that extends to the rim of the SOI substrate 10. The device layer 12 is electrically isolated from the handle wafer 16 by the BOX layer 14.

A pad layer 18 is located on a top surface of the device layer 12. The pad layer 18 may be composed of a dielectric material, such as silicon nitride ($Si_3N_4$) deposited by chemical vapor deposition. The pad layer 18 may further include an optional thin silicon dioxide layer grown by oxidizing the top surface of the device layer 12 with a wet or dry oxidation process. The dielectric material constituting the pad layer 18 is chosen to provide etch selectivity relative to the semiconductor material constituting the device layer 12, and may serve as a hardmask during subsequent stages of the fabrication process.

A deep trench 20 extends from a top surface of the device layer 12 through the device layer 12 and the buried insulator layer 14, and penetrates to a given depth within the handle wafer 16. After the pad layer 18 is patterned using an etch mask to define an opening in the pad layer 18 at the intended location of the deep trench 20, the deep trench 20 may be formed by a wet chemical etching process, a dry etching process (e.g., reactive-ion etching (RIE)), or a combination of these etching processes conducted in one or more steps using one or more etch chemistries. The portion of the handle wafer 16 adjacent to a bottom section of the deep trench 20 will eventually provide a plate electrode for a deep trench capacitor 46 of the device structure and may be shared as a plate electrode with other deep trench capacitors in an array including the deep trench capacitor 46.

An insulator layer 22 is formed on the interior surface of the deep trench 20. The insulator layer 22 may be comprised of an electrical insulator characterized by a dielectric constant (e.g., permittivity) characteristic of a dielectric material. In an embodiment, the insulator layer 22 may be comprised of a high-k dielectric deposited by, for example, atomic layer deposition (ALD). For example, the high-k dielectric material comprising insulator layer 22 may be a hafnium-based dielectric material such as hafnium dioxide ($HfO_2$) or hafnium silicate ($HfSiO_4$), aluminum oxide ($Al_2O_3$), or a layered stack of these or other similar materials.

After the insulator layer 22 is formed, a lower section 23 of a plug 24 is formed inside a corresponding lower section of the deep trench 20. A top surface 21 of the plug 24 is located in a plane that is below the interface between the device layer 12 and BOX layer 14 and above the interface between the handle wafer 16 and BOX layer 14. In an embodiment, the top surface 21 of the plug 24 may be located equidistant vertically between the interface between the device layer 12 and BOX layer 14 and the interface between the handle wafer 16 and BOX layer 14. The plug 24 eventually forms a storage electrode for the deep trench capacitor 46. The insulator layer 22 operates as a capacitor dielectric for the deep trench capacitor 46 of the device structure by isolating the electrodes from each other.

The lower section 23 of the plug 24 may be comprised of a semiconductor material that is deposited by chemical vapor deposition, planarized with chemical mechanical polishing (CMP), and recessed within the deep trench 20 by an etching process, such as reactive-ion etching (RIE), selected to remove the material of the plug 24 selective to (i.e., at a greater etch rate than) the dielectric material of the pad layer 18. The lower section 23 of the plug 24 may have the same conductivity type as the handle wafer 16 local to the deep trench 20, and may be in situ doped during deposition. For example, the lower section 23 of the plug 24 may be comprised of polycrystalline silicon (i.e., polysilicon) that is in situ doped during deposition with an n-type dopant from Group V of the Periodic Table (e.g., phosphorus (P), arsenic (As), or antimony (Sb)) in a concentration that is effective to impart n-type conductivity.

A liner layer (not shown) may be formed on the insulator layer 22 before the lower section 23 of the plug 24 is formed. The liner layer may be comprised of titanium (Ti), titanium nitride (TiN), tantalum (Ta), tantalum nitride (TaN), or a multilayer combination of these materials deposited using, for example, physical vapor deposition (PVD). After the plug 24 is recessed, the insulator layer 22 and liner layer may be removed from the interior surface of the deep trench 20 above the top surface of the lower section 23 of the plug 24 by a wet and/or dry etching processes.

Figure 2:
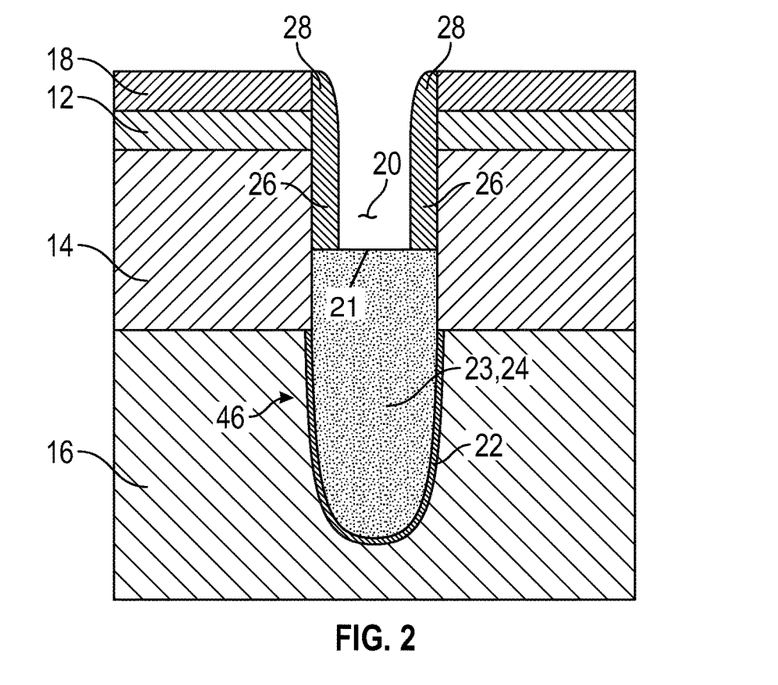

With reference to FIG. 2 in which like reference numerals refer to like features in FIG. 1 and at a subsequent fabrication stage of the processing method, a spacer 26 is formed on the interior surface of the deep trench 20 over a height or distance that may extend from the top surface of the pad layer 18 to the top surface 21 of the plug 24. The spacer 26 may be formed by depositing a conformal layer comprised of an electrical insulator, such as an oxide of silicon (e.g., silicon dioxide) deposited by atomic layer deposition (ALD), having a given thickness and shaping the conformal layer with an anisotropic etching process, such as reactive ion etching, that preferentially removes the electrical insulator from horizontal surfaces. The spacer 26 is an annular structure with the thickness bounded between the outer cylindrical surface at its outer circumference (i.e., outer diameter) and the inner cylindrical surface at its inner circumference (i.e., inner diameter). The spacer 26 extends circumferentially about the inner surface of the deep trench 20 above the lower section 23 of the plug 24 and effectively narrows the width of an upper section of the deep trench 20 that is located above the lower section 23 of the plug 24.

A collar 28 is defined by a portion of the spacer 26 located above the interface 15 (FIG. 5B) between the device layer 12 and BOX layer 14. In the representative embodiment, the collar 28 has a top surface located between the top surface of the pad layer 18 and the top surface of the device layer 12. However, the top surface of the collar 28 may be in the same plane as the top surface of the device layer 12. The collar 28 intervenes as a structure between the device layer 12 and the interior of the trench 20. The collar 28 is a portion of the spacer 26 located remote from the lower section 23 of the plug 24, and is separated from the lower section 23 of the plug 24 by another portion of the spacer 26.

Figure 3:
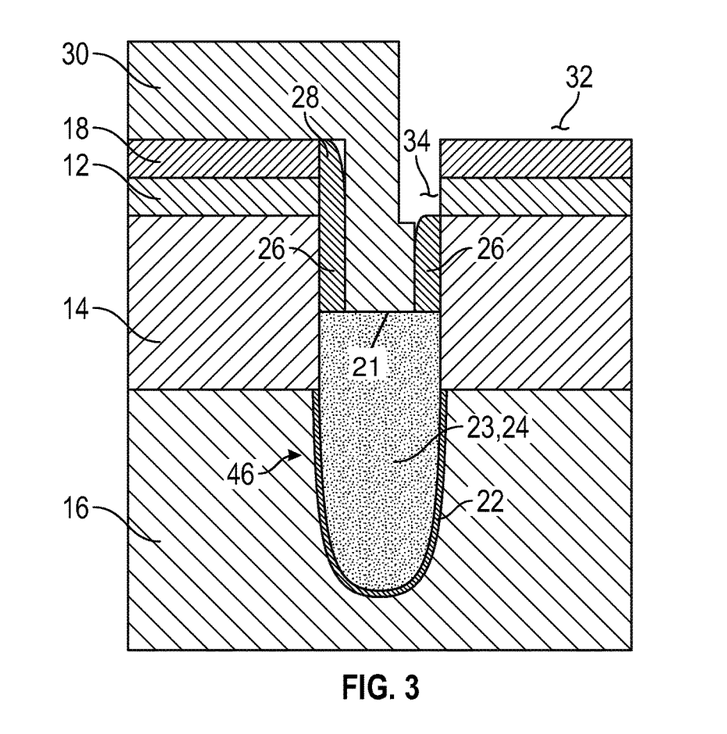
Figure 3A:
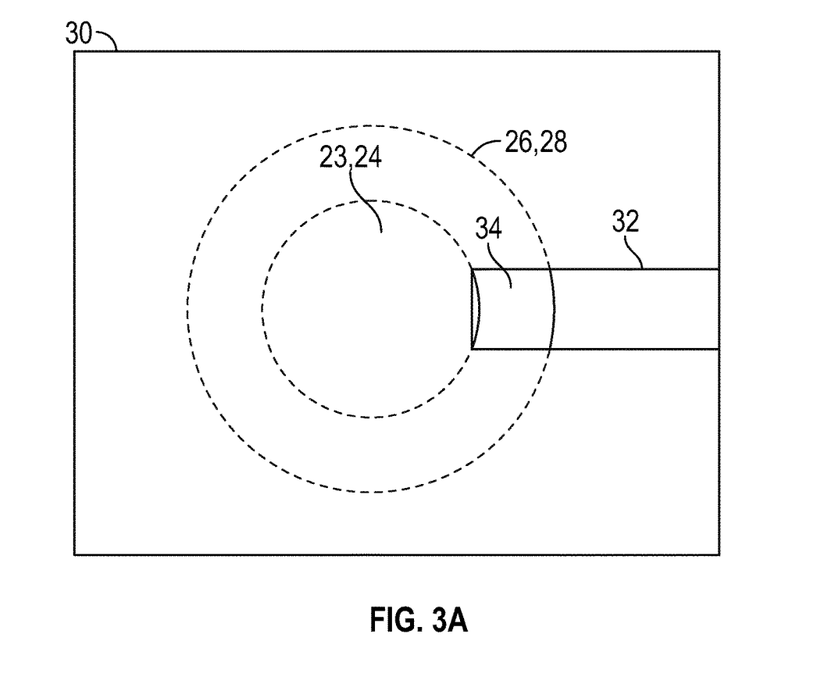
FIG. 3A is an top view of the device structure of FIG. 3.

With reference to FIGS. 3, 3A in which like reference numerals refer to like features in FIG. 2 and at a subsequent fabrication stage of the processing method, a patterned etch mask 30 is applied. The etch mask 30 may be comprised of a layer of a light-sensitive material, such as an organic photoresist, an anti-reflection coating, and/or an organic planarization layer (OPL), that may be applied by a spin coating process, pre-baked, exposed to light projected through a photomask, baked after exposure, and developed with a chemical developer. The etch mask 30 is patterned to include an opening 32 that coincides with the location of a portion of the collar 28 and that extends across the entire thickness of the collar 28 from its outer circumference (i.e., outer diameter) to its inner circumference (i.e., inner diameter). The opening 32 may extend past the collar 28 to partially overlap with the space inside the deep trench 20 above the lower section 23 of the plug 24. The portion of the collar 28 aligned with the opening 32 may be an arc length less than the entire circumference of the collar 28, and may represent only a small fraction of the entire circumference of the collar 28.

An etching process is used to remove the portion of the collar 28 aligned with the opening 32 such that a notch 34 is defined in the collar 28. The notch 34 is an opening between the interior and exterior surfaces of the collar 28 that extends through (i.e., perforates an entire thickness of) the collar 28. The notch 34 provides a path connecting the storage electrode inside the deep trench 20 through an interior of the collar 28 and notch 34 to the device layer 12 as a strap connection. The height of the spacer 26 (i.e., collar 28) is reduced at the location of the notch 34. In the representative embodiment, a top surface of the spacer 26 at the location of the notch 34 is located at or near the interface between the device layer 12 and BOX layer 14 such that the notch 34 extends over the entire height of the collar 28. The etching processing may comprise a wet chemical etching process or a dry etching process, such as reactive-ion etching (RIE). If the collar 28 is comprised of silicon dioxide and the lower section 23 of the plug 24 is comprised of polysilicon, a dry oxide etching process using, for example, a fluorine-based source gas may be employed to remove the material of the collar 28 selective to (i.e., at a higher etch rate than) the materials of the lower section 23 of the plug 24 and the pad layer 18.

The etch mask 30 may be subsequently removed after completion of the etching process forming the notch 34. If comprised of a photoresist, the etch mask 30 may be removed by ashing or a sulfuric-acid-containing wet chemical, followed by a cleaning process.

Figure 4:
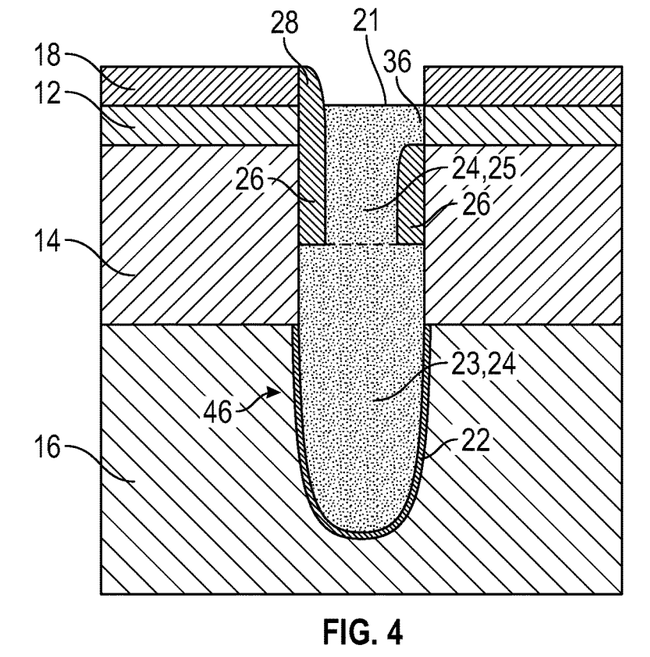

With reference to FIG. 4 in which like reference numerals refer to like features in FIGS. 3, 3A and at a subsequent fabrication stage of the processing method, an upper section 25 of the plug 24 is formed in a corresponding upper section of the deep trench 20 inside the open space inside the spacer 26 above the lower section 23 of the plug 24 and a portion of a connection strap 36 is formed inside the notch 34 (FIGS. 3, 3A) in the collar 28. The upper section 25 of the plug 24 is located on at top surface of the lower section 23 of the plug 24. The upper section 25 of the plug 24 and connection strap 36 may be comprised of a conductor, which may be the same conductor (e.g., doped polysilicon) as in the original fill forming the lower section 23 of the plug 24. The upper section 25 of the plug 24 and connection strap 36 may be formed by depositing the conductor, planarizing relative to the pad layer 18 using chemical mechanical polishing or a dry etch, and recessing the top surface 21 of the plug 24 and connection strap 36 to a level at or above the top surface of device layer 12 by an etching process, such as reactive-ion etching.

The upper section 25 of the plug 24 is additive to the lower section 23 of the plug 24, and raises the location of the top surface 21 of the plug 24. In an embodiment, the top surface 21 of the plug 24 may be located in a plane that is raised above the interface between the device layer 12 and BOX layer 14 and at or above the top surface of the device layer 12. At this point in the processing method, the top surface of the connection strap 36 may be coplanar with the top surface 21 of the plug 24.

In an embodiment, the notch 34 (FIGS. 3, 3A) in the collar 28 may be formed with dry etching to limit lateral etching during pre-cleaning (e.g., with buffered hydrofluoric acid) performed in advance of depositing the upper section 25 of the plug 24. In an embodiment, the spacer 26 may further include an outer layer of polysilicon originating from a polysilicon layer deposited on the insulator layer and shaped along with the oxide layer. The polysilicon outer layer may be effective to protect the dielectric material of the collar 28 against etching during the pre-cleaning process.

Figure 5:
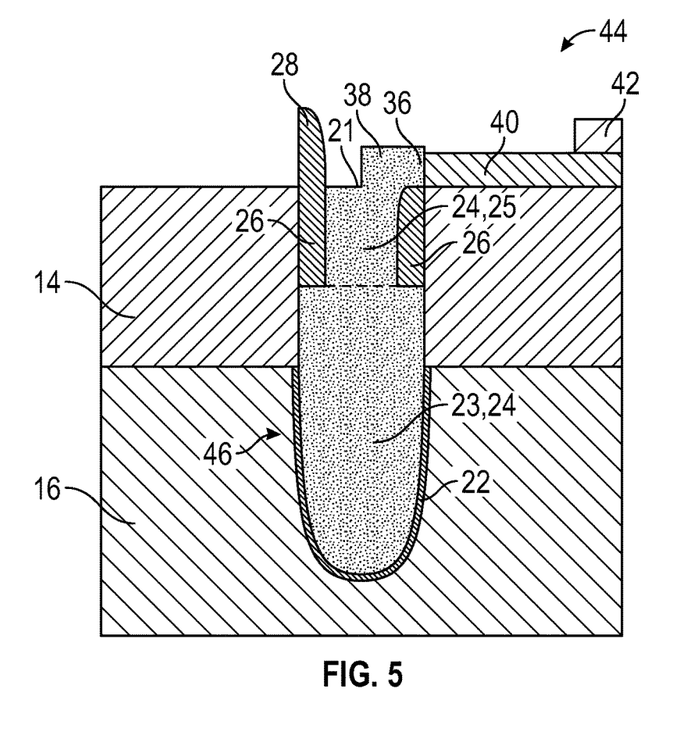
Figure 5A:
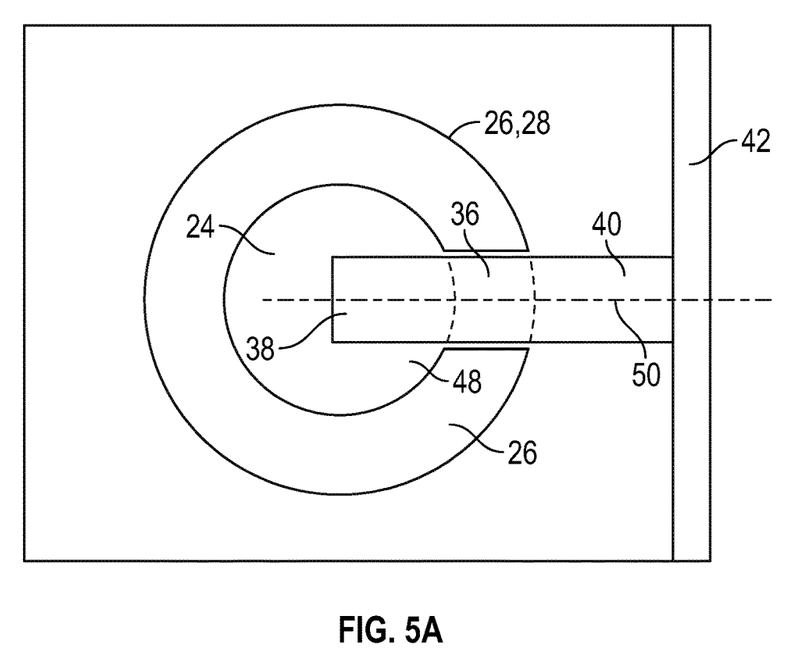
FIG. 5A is an top view of the device structure of FIG. 5.
Figure 5B:
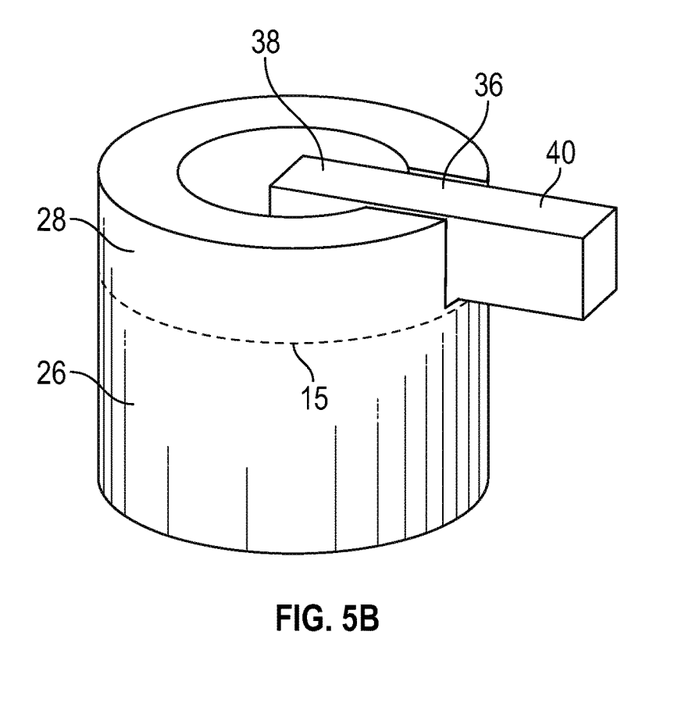
FIG. 5B is a perspective view in which only the fins, connection strap, and collar are shown for purposes of description.

With reference to FIGS. 5, 5A, 5B in which like reference numerals refer to like features in FIG. 4 and at a subsequent fabrication stage of the processing method, the device layer 12 is patterned to define a fin 40 as a three-dimensional device body of semiconductor material originating from the device layer 12 and that projects vertically relative to a plane containing a top surface of the BOX layer 14. In the representative embodiment, the fin 40 has a uniform size and a rectangular shape. The fin 40 is aligned with the notch 34 in the collar 28 and is contiguous with the connection strap 36 inside the notch 34 in the collar 28.

When the fin 40 is formed from the device layer 12, the semiconductor material of the plug 24 is also patterned to form a fin 38 inside the deep trench 20. The fin 38 is composed of a different semiconductor material (i.e., semiconductor material originating from the plug 24) than the fin 40 (i.e., semiconductor material originating from the device layer 12). The fin 38 overlies the top surface 21 of the plug 24. The connection strap 36 is located between fin 40 and fin 38, and the fins 38, 40 and connection strap 36 are aligned relative to a longitudinal axis 50. The connection strap 36 and the fin 38 inside the trench 20 provide physical continuity and a current path between the fin 40 outside the trench 20 and the plug 24 inside the deep trench 20. This current path may be used for charge transfer to, for example, read information from and write information to the deep trench capacitor 46. The fins 38, 40 and connection strap 36 project upwardly from a plane defined by the interface 15 between the device layer 12 and the BOX layer 14. The collar 28 projects to or above a top surface of the fins 38, 40. In the representative embodiment, the collar 28 projects above the top surface of the fins 38, 40.

The fins 38, 40 may be concurrently formed by photolithography and subtractive etching processes. To that end, the fins 38, 40 may be formed, for example, using a sidewall image transfer (SIT) process. To that end, a cap layer and a sacrificial layer may be serially deposited on the top surface of the pad layer 18 and the sacrificial layer patterned to define a mandrel. Spacers are then formed on the sidewalls of the mandrels. The mandrels are then selectively removed relative to the spacers using an etching process. The semiconductor materials of the device layer 12 and the plug 24 are patterned with an etching process, such as reactive-ion etching, using one or more etching chemistries with each spacer operating as an etch mask. The connection strap 36 is masked and preserved when the fins 38, 40 are formed such that the connection strap 36 and fins 38, 40 form a semiconductor body that is partially positioned inside the collar 28, is partially positioned in the notch 34, and is partially positioned outside of the collar 28. The spacers and cap layer may be removed subsequent to the etching process so that the exterior surfaces of the connection strap 36, fin 38, and fin 40 are exposed.

FIG. 5A shows a top view with the notched collar and fin structure, and FIG. 5B shows a perspective view of the structure for an embodiment of the invention. In particular, the wall of collar 28 operates as a protective layer and the notch 34 defines a path for the strap connection 36 between the storage electrode in trench 20 and a source/drain of the access transistor that is formed using fin 40.

A gate structure 42, which includes a gate dielectric and a gate electrode, extends transversely across the fin 40. The fin 40 includes highly-doped source and drain regions that that are not covered by the gate structure 42. A central portion of the fin 40, which is covered by the gate structure 42, may define a channel of a fin-type field effect transistor (FinFET) 44. The FinFET 44 forms a memory cell (e.g., an eDRAM memory cell) in conjunction with the deep trench capacitor 46 to which it is connected by the connection strap 36.

The gate structure 42 may be formed by patterning a deposited layer stack of their constituent materials using photolithography and etching processes. The gate dielectric of the gate structure 42 may be comprised of an electrical insulator with a dielectric constant (e.g., a permittivity) characteristic of a dielectric material. For example, the gate dielectric may be comprised of silicon dioxide, silicon oxynitride, a high-k dielectric material such as hafnium oxide, or layered combinations of these dielectric materials, deposited by chemical vapor deposition, atomic layer deposition, etc. The gate dielectric separates the gate electrode from the fin 40 as an intervening structure. The gate electrode of the gate structure 42 may be comprised of an electrical conductor, such as a metal, a silicide, doped polysilicon, or a combination of these materials deposited by physical vapor deposition, chemical vapor deposition, etc. The source and drain regions may be formed by introducing a dopant into the semiconductor material of the fin 40 that is not covered by the gate structure 42. Dielectric spacers (not shown) may be formed on the sidewalls of the gate structure 42. A replacement gate structure is possible even though a gate first structure is described in the representative embodiment.

Figure 6:
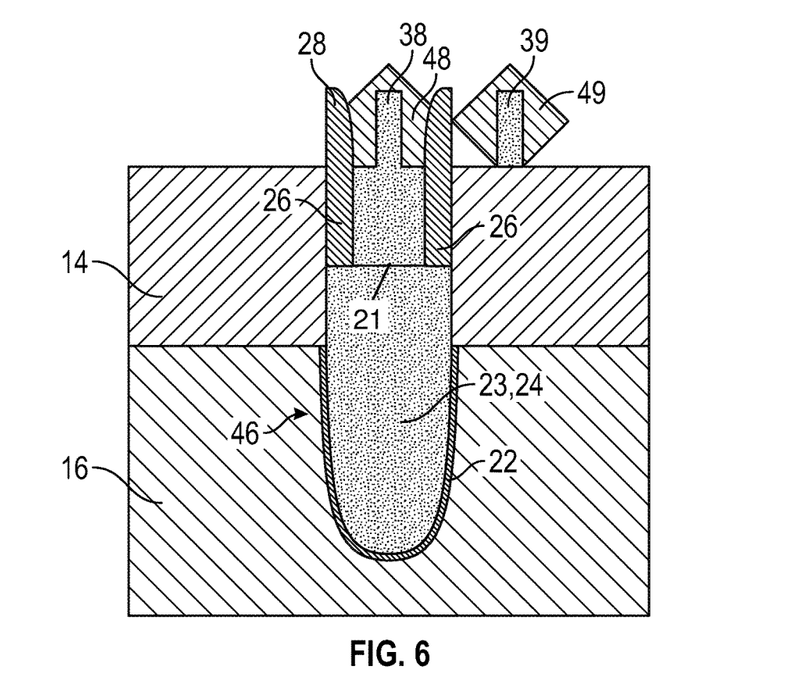
FIG. 6 is a cross-sectional view of the device structure of FIG. 5 along a perspective parallel to the long axis of the fins and at a subsequent stage of the fabrication process.

With reference to FIG. 6 in which like reference numerals refer to like features in FIGS. 5, 5A, 5B and at a subsequent fabrication stage of the processing method, an epitaxial layer 48 may be grown on the fins 38, 39 and fin 40 (FIG. 5). In an embodiment, the epitaxial layer 48 may be formed by a selective epitaxial growth process. Because of the selective nature of epitaxial growth process, the semiconductor material constituting the epitaxial layer 48 does not nucleate for epitaxial growth from surfaces of an electrical insulator (e.g., the collar 28). The epitaxial layer 48 may increase the available surface area for landing a contact to provide a source or drain connection and/or may provide a dopant source for doping the source and drain regions in the fin 40 to decrease their resistivity.

The collar 28 creates an insulator wall surrounding the deep trench 20 extending to or above a top surface of the fins 38, 40 and has a wall height that effectively increases the spacing relative to adjacent deep trenches. In particular, the collar 28 functions to confine the growth front of the epitaxial layer 48 advancing outwardly from the fin 38 so that the epitaxial layer 48 cannot merge with, for example, a similar epitaxial layer 49 growing from a neighboring fin 39 of the same type and cause a short. This confinement may reduce the failure probability of the memory cell by eliminating or resolving the bridging phenomenon, and removes a limitation on the epitaxial growth used to merge fins in a logic region (not shown) with adjacent fins in the logic region when epitaxial semiconductor material is simultaneously grown in both the logic and DRAM memory regions. The thickness of the collar 28 may be adjusted to control an amount of epitaxial semiconductor material that is grown on the fin 38 inside the deep trench 20. Decreasing the thickness of the collar 28 will permit an increase in the amount of epitaxial semiconductor material added to the fin 38, which may reduce electrical resistance.

Figure 7:
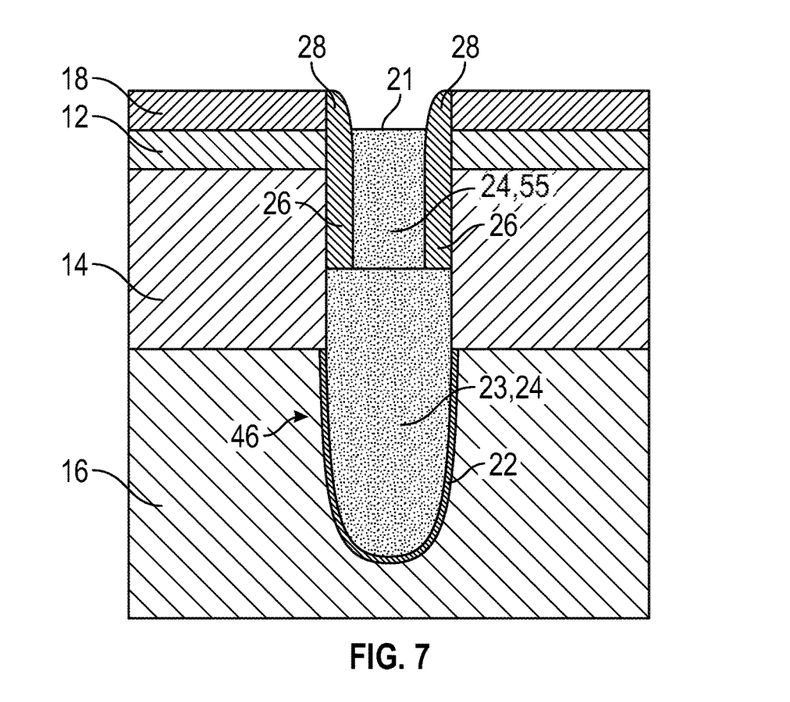
FIGS. 7-9 are cross-sectional views of a portion of a substrate illustrating successive stages of a fabrication process forming a device structure in accordance with an alternative embodiment of the invention.

With reference to FIG. 7 in which like reference numerals refer to like features in FIG. 2 and at a subsequent fabrication stage of a processing method in accordance with an alternative embodiment, an upper section 55 of the plug 24 is formed on the lower section 23 of the plug 24 before the collar 28 is notched and the strap is formed. The upper section 55 of the plug 24 may be comprised of a conductor, which may be the same conductor (e.g., doped polysilicon) as in the original fill forming the lower section 23 of the plug 24. The upper section 55 of the plug 24 may be formed by depositing the conductor, planarizing with chemical mechanical polishing relative to the pad layer 18, and recessing the top surface 21 of the plug 24 to a level at or above the top surface of device layer 12 by an etching process, such as reactive-ion etching. The upper section 55 of the plug 24 is additive to the lower section 23 of the plug 24, and raises the location of the top surface 21 of the plug 24. In an embodiment, the top surface 21 of the plug 24 may be located in a plane that is above the interface between the device layer 12 and BOX layer 14 and at or above the top surface of the device layer 12.

Figure 8:
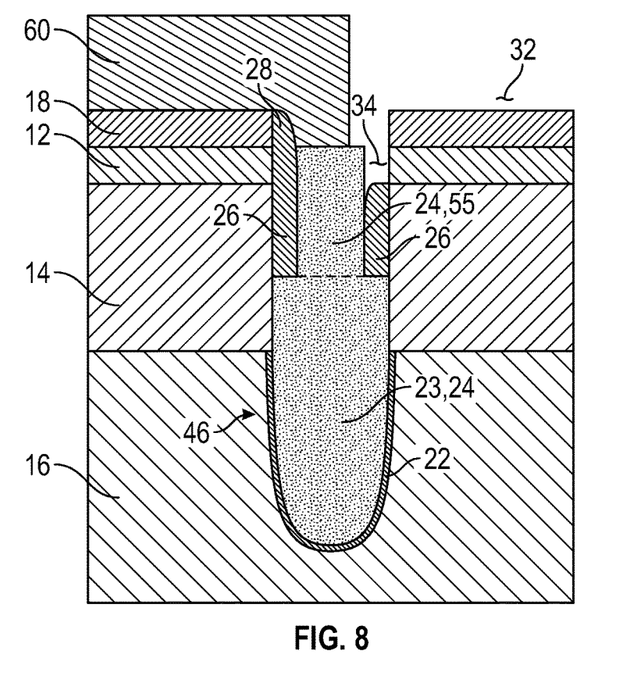

With reference to FIG. 8 in which like reference numerals refer to like features in FIG. 7 and at a subsequent fabrication stage of the processing method, a patterned etch mask 60 similar to etch mask 30 is applied. The etch mask 60 may be comprised of a layer of a light-sensitive material, such as an organic photoresist and/or an organic planarization layer (OPL), that may be applied by a spin coating process, pre-baked, exposed to light projected through a photomask, baked after exposure, and developed with a chemical developer. The etch mask 60 is patterned to include the opening 32 that coincides with the location of a portion of the collar 28 and that extends across the entire thickness of the collar 28, as discussed hereinabove. The portion of the collar 28 aligned with the opening 32 is removed by an etching process using an etch chemistry selected to partially remove the constituent dielectric material and define a notch 34 in the collar 28, as discussed hereinabove. The etch mask 60 may be subsequently removed after completion of the etching process. If comprised of a photoresist, the etch mask 60 may be removed by ashing or a sulfuric-acid-containing wet chemical, followed by a cleaning process.

Figure 9:
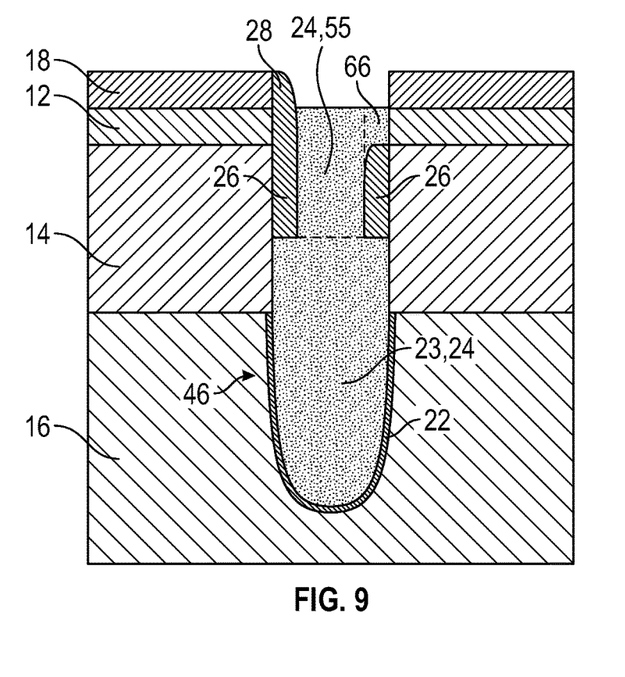

With reference to FIG. 9 in which like reference numerals refer to like features in FIG. 8 and at a subsequent fabrication stage of the processing method, a connection strap 66 similar to connection strap 36 is formed inside the notch 34 (FIG. 8) in the collar 28. The connection strap 66 may be comprised of a conductor, which may be the same conductor (e.g., doped polysilicon) as in the original fill forming the sections 23, 55 of the plug 24. The connection strap 66 may be formed by depositing the conductor, planarizing with chemical mechanical polishing relative to the pad layer 18, and recessing the top surface 21 of the plug 24 and connection strap 66 to a level at or above the top surface of device layer 12 by an etching process, such as reactive-ion etching. The connection strap 66 may be formed from a thin layer of the conductor that is deposited to fill the notch 34 and then etched back with a wet or dry etching process to reduce its thickness and thereby without the necessity of chemical mechanical polishing.

Processing continues as described in connection with FIG. 5 to fashion the fins 38, 40 coupled together by the connection strap 66.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a substrate, the device structure comprising:
    a deep trench capacitor including a deep trench formed in the substrate and an electrode inside the deep trench;
    a collar located at least partially inside an upper section of the deep trench, the collar comprised of an electrical insulator, and the collar including a notch that extends through the collar;
    a connection strap positioned inside the notch; and
    a field effect transistor including a first fin coupled by the connection strap with the electrode inside the deep trench,
    wherein the first fin is comprised of a first semiconductor material, and the electrode is comprised of a second semiconductor material, and the connection strap is comprised of the second semiconductor material.

2. The device structure of claim 1 wherein the electrode includes a first section and a second section located on the first section, further comprising:
    a spacer located in the deep trench above the first section of the electrode,
    wherein the spacer is comprised of the electrical insulator, and the collar is a portion of the spacer.

3. The device structure of claim 2 wherein the spacer surrounds the second section of the electrode.

4. The device structure of claim 1 wherein the substrate is a semiconductor-on-insulator (SOI) substrate, the first fin is formed from a device layer of the SOI substrate, the deep trench extends through the device layer and a buried oxide layer into a handle wafer of the SOI substrate, and the collar projects to or above a top surface of the first fin.

5. The device structure of claim 1 further comprising:
    a second fin located inside the deep trench, the second fin coupled with the electrode, the second fin coupled with the first fin by the connection strap, and the connection strap located between the second fin and the first fin.

6. The device structure of claim 5 further comprising:
    an epitaxial layer located on the second fin,
    wherein the collar is configured to confine the epitaxial layer inside of the collar.

7. The device structure of claim 5 wherein the first fin, the second fin, and the connection strap are aligned relative to a longitudinal axis, and the first fin, the second fin, and the connection strap are contiguous.

8. The device structure of claim 5 wherein the first semiconductor material of the first fin is single crystal, and the second fin and the connection strap are comprised of a layer of polycrystalline semiconductor material.

9. A device structure formed using a deep trench in a substrate, the device structure comprising:
    a collar extending circumferentially about the deep trench, the collar comprised of an electrical insulator, and the collar including a notch connecting an interior of the collar with an exterior of the collar;
    an electrode inside the deep trench; and
    a semiconductor body including a first fin and a connection strap, the connection strap positioned inside the notch in the collar,
    wherein the first fin is comprised of a first semiconductor material that is single crystal, the electrode is comprised of a second semiconductor material, the connection strap is comprised of the second semiconductor material, and the collar projects to or above a top surface of the first fin.

10. The device structure of claim 9 wherein the substrate is a semiconductor-on-insulator (SOI) substrate including a buried oxide layer and a device layer, the single crystal semiconductor material comprising the first fin is a portion of the device layer, and the first fin is positioned on the buried oxide layer.

11. The device structure of claim 10 wherein the semiconductor body includes a second fin comprised of polycrystalline semiconductor material, the second fin is positioned inside of the collar, and the second fin is coupled with the first fin by the connection strap.

12. A method of fabricating a device structure, the method comprising:
    forming a deep trench capacitor in a substrate;
    forming a collar comprised of an electrical insulator at least partially inside an upper section of a deep trench in which the deep trench capacitor is formed;
    removing a portion of the collar to define a notch extending through the collar;
    forming a connection strap in the notch; and
    forming a first fin from a first semiconductor material comprising the substrate,
    wherein the first fin is coupled by the connection strap with an electrode of the deep trench capacitor that is located inside the deep trench, the electrode is comprised of a second semiconductor material, and the connection strap is comprised of the second semiconductor material.

13. The method of claim 12 wherein forming the deep trench capacitor in the substrate comprises:
    before the collar is formed, forming a first section of the electrode in a lower section of the deep trench;
    after the notch is formed, forming a second section of the electrode in the upper section of the deep trench,
    wherein the connection strap and the second section of the electrode are comprised of a layer of polycrystalline semiconductor material.

14. The method of claim 13 wherein forming the collar comprises:
    before the second section of the electrode is formed, forming a spacer in the upper section of the deep trench above the first section of the electrode,
    wherein the collar is a portion of the spacer.

15. The method of claim 12 wherein forming the deep trench capacitor in the substrate comprises:
    before the collar is formed, forming a first section of the electrode in a lower section of the deep trench; and
    after the collar is formed, forming a second section of the electrode in the upper section of the deep trench.

16. The method of claim 15 wherein forming the connection strap in the notch comprises:

after the notch and the second section of the electrode are formed, depositing the second semiconductor material that fills the notch to form the connection strap.

17. The method of claim 12 wherein the substrate is a semiconductor-on-insulator (SOI) substrate, the first fin is formed from the semiconductor material of a device layer of the SOI substrate, the deep trench extends through the device layer and a buried oxide layer into a handle wafer of the SOI substrate, and the collar projects to or above a top surface of the first fin.

18. The method of claim 12 further comprising:
forming a second fin inside the deep trench that is coupled with the electrode,
wherein the second fin is coupled with the first fin by the connection strap, and the connection strap is located between the second fin and the first fin.

19. The method of claim 18 further comprising:
growing an epitaxial layer on the second fin,
wherein the collar is positioned to block advance of a growth front for the epitaxial layer such that the epitaxial layer is confined inside the collar.

* * * * *